(12) United States Patent
Okamoto et al.

(10) Patent No.: US 6,958,490 B2
(45) Date of Patent: Oct. 25, 2005

(54) LIGHT-EMITTING APPARATUS

(75) Inventors: Satoru Okamoto, Kanagawa (JP); Shigeharu Monoe, Kanagawa (JP); Takashi Yokoshima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/744,975

(22) Filed: Dec. 22, 2003

(65) Prior Publication Data

US 2004/0135151 A1 Jul. 15, 2004

(30) Foreign Application Priority Data

Dec. 27, 2002 (JP) ........................................ 2002-381790

(51) Int. Cl.[7] .............................................. H01L 35/24
(52) U.S. Cl. ........................... 257/40; 257/99; 257/763; 313/504
(58) Field of Search ........................... 257/40, 103, 59, 257/72, 98, 99, 763, 764; 313/504; 438/29, 99

(56) References Cited

U.S. PATENT DOCUMENTS

| | | | |
|---|---|---|---|
| 6,091,195 A | 7/2000 | Forrest et al. ............... 313/504 |
| 6,396,208 B1 * | 5/2002 | Oda et al. .................... 313/504 |
| 6,597,121 B2 | 7/2003 | Imura ........................ 315/169.3 |
| 6,608,353 B2 | 8/2003 | Miyazaki et al. ............ 257/350 |
| 6,692,845 B2 * | 2/2004 | Maruyama et al. .......... 428/690 |
| 6,717,181 B2 * | 4/2004 | Murakami et al. ............. 257/72 |
| 6,787,796 B2 * | 9/2004 | Do et al. ........................ 257/40 |
| 2002/0063515 A1 | 5/2002 | Goto ............................ 313/500 |

FOREIGN PATENT DOCUMENTS

| | | |
|---|---|---|
| JP | 2002-015860 | 1/2002 |
| JP | 2002-132186 | 5/2002 |
| JP | 2002-208491 | 7/2002 |

* cited by examiner

*Primary Examiner*—Sara Crane
(74) *Attorney, Agent, or Firm*—Cook, Alex, McFarron, Manzo, Cummings & Mehler, Ltd.

(57) ABSTRACT

A light-emitting device, which has a structure that improves an opening ratio and light extraction efficiency, can solve a problem of an etching residue occurred during forming the device itself, and reduce deterioration due to poor coverage and short-circuiting to improve greatly the reliability, and a method for manufacturing the light-emitting device. In the light-emitting device having a structure that improves light extraction efficiency, a material used for forming a first electrode is Ti/TiN/Al (or Al—Ti)/Ti (or TiN).

33 Claims, 13 Drawing Sheets light emitting region

- light emitting region
- semiconductor layer
- gate metal
- wiring
- first electrode FIG. 4A (type 1)
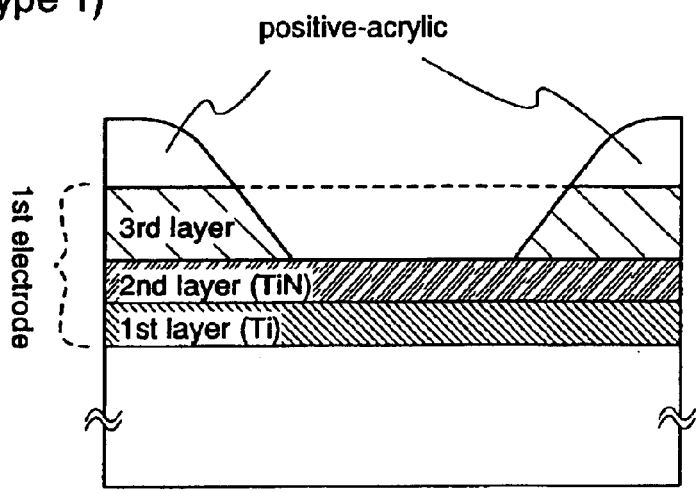
FIG. 4B (type 2)
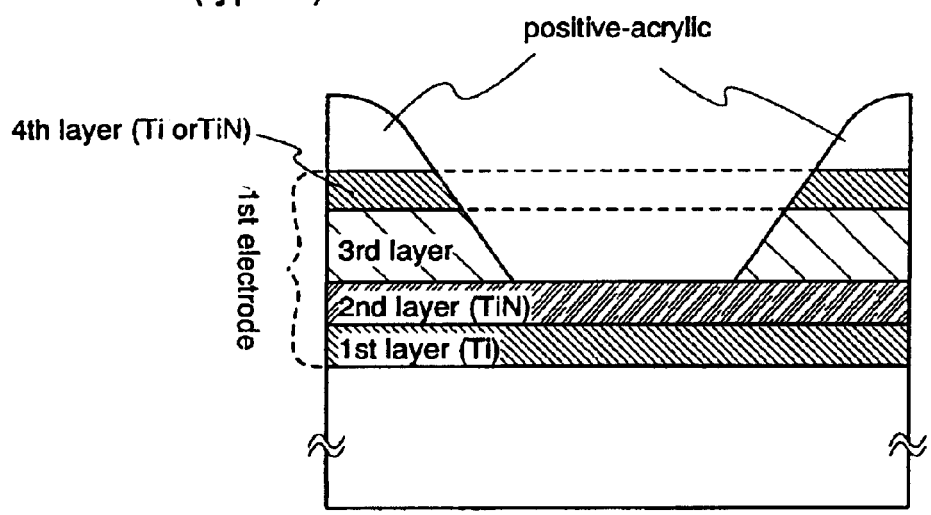

LIGHT-EMITTING APPARATUS

BACKGROUND OF THE INVENTION

1. Field of the Invention

The present invention relates to a light-emitting apparatus comprising a light-emitting device, which emits fluorescence or phosphoresce upon applying an electric field to the light-emitting device, including a pair of electrodes and a film containing an organic compound (hereinafter, an organic compound layer) interposed between the pair of electrodes, and to a method for manufacturing the light-emitting apparatus. In this specification, the light-emitting apparatus includes an image display apparatus, a light-emitting device, or a light source (including a lighting system). Also, the following modules are included in the light-emitting apparatus: a module attached with a connector such as an FPC (flexible printed circuit), a TAB (tape automated bonding) tape, or a TCP (tape carrier package); a module provided a PWB (printed wiring board) with a tip of the TAB tape or the TCP; and a module provided an IC (integrated circuit) directly with a light-emitting device by the COG (chip on glass).

2. Related Art

A light-emitting device using an organic compound as a luminous body, which is characterized by their thinness and light weight, fast response, and direct current low voltage driving, and so on, is expected to be applied to next-generation flat panel displays. Particularly, a light-emitting apparatus in which light-emitting devices are arranged in a matrix configuration are considered to be superior to the conventional liquid crystal display devices for their wide viewable angle and excellent visibility.

The luminescent mechanism of the light-emitting device is as follows: an electric field is applied to a pair of electrodes that sandwich an organic compound layer, and electrons injected from a cathode and holes injected from an anode are re-combined at the luminescent center of the organic compound layer to form molecular excitons, and then the molecular excitons revert to a ground state while radiating energy, consequently, luminescence radiation takes place in the organic compound layer. Known excitation states are an excited singlet state and an excited triplet state. The luminescence radiation is allowed to take place by reverting from either state to the ground state.

A light-emitting apparatus composed of a plurality of light-emitting devices being arranged in a matrix configuration may be operated by one of well-known driving systems such as a passive matrix drive and an active matrix drive. However, when a pixel density increases, it may be preferable to use an active matrix type system in which a switch is provided in every pixel (or every dot) because it can be driven at a low voltage.

A low-molecular organic material and a polymer organic material are studied as a material for forming a layer containing an organic compound that is almost a center of a light-emitting device. The polymer organic material is attracted more attention than the low-molecular organic material since the polymer organic material has higher usability and heat resistance than those of the low-molecular organic material. In addition, the layer containing an organic compound may be formed of a composite material made of the polymer organic material and an inorganic material.

The conventional active matrix light-emitting apparatus is manufactured to have the structure in which an electrode connected electrically to a TFT over a substrate is formed as an anode, a layer containing an organic compound is formed over the anode, a cathode is formed over the layer containing an organic compound, and light generated in the layer containing an organic compound is extracted through the anode, which is transparent to light, in the direction of the TFT.

However, in case of trying to improve resolution, there is a problem in that structure that an opening ratio is restricted by arrangement of a TFT, a wiring, or the like in a pixel portion.

Measures against the restriction of the opening ratio has been proposed that light emitted except in the direction of an opening portion is deflected and reflected, that is, the extraction efficiency of light generated in the layer containing an organic compound is improved (For example, see JP 2002-208491, and U.S. Pat. No. 6,091,195).

In view of the problems of an opening ratio and light extraction efficiency, it is effective to countermeasure against the problems by manufacturing an active matrix light-emitting apparatus having a top emission light-emitting device and having the structure to increase the amount of light extracted in the certain direction. Thus, it is effective to manufacture the structure by which light extraction efficiency is improved, while the restriction of the opening ratio being lightened.

The present invention is constituted by the structure in which a light-emitting device comprises a substrate having an insulating surface, a first electrode connected to a TFT, an insulator covering the edge of the first electrode, a layer containing an organic compound on the first electrode, and a second electrode on the layer containing an organic compound. The edge of the first electrode is formed to have an inclined plane toward a central portion of the first electrode. The inclined plane reflects light generated in the layer containing an organic compound. The inclined plane of the first electrode for reflecting light generated in the layer containing an organic compound is formed by etching a metal layer with a multiplayer structure, simultaneously with exposing a layer serving as an anode (or a cathode). At this time, an etching residue may be generated on the anode (or a cathode).

The etching residue causes defects such as poor coverage, or short-circuiting of the second electrode. Further, the etching residue affects adversely the reliability and the yields of final products a lot.

SUMMARY OF THE INVENTION

In view of the foregoing, it is an object of the present invention is to provide a light-emitting device which can improve an opening ratio and light extraction efficiency and which is capable of reducing defects such as poor coverage or short-circuiting and improving drastically the reliability by solving the problem of an etching residue, and a method for manufacturing the light-emitting device.

In the present invention, a first electrode comprising four layers is formed, that is, a first layer formed of titanium (Ti), a second layer formed of titanium nitride (TiN), a third layer formed of aluminum or aluminum containing titanium of from 0.1 to 5% (hereinafter, Al—Ti), and a fourth layer formed of titanium (Ti). An insulator (also referred to as a bank) for covering the first electrode is formed. Then, a part of the insulator and the fourth layer (Ti) and the third layer (Al—Ti or Al) are etched in a self aligning manner using the insulator as a mask to expose the second layer (TiN) and form an inclined plane at the edge of the first electrode.

According to this, the central portion of the first electrode comes to have two layers (Ti and TiN) and flat surface, and the edge of the first electrode remains having four layers (Ti, TiN, Al (or Al—Ti), Ti). Consequently, the first electrode has a concave shape. Then, a light-emitting device is completed by forming a layer containing an organic compound over the first electrode and a second electrode. In addition, the fourth layer may be formed of TiN.

According to the present invention, the amount of light extracted in a certain direction (a direction passing through the second electrode) is increased by reflecting or condensing light emitted in the lateral direction by an inclined plane at a step portion of the first electrode formed by etching.

Therefore the inclined plane is preferably formed of a material containing metal as its component that reflects light. Further, the inclined plane is required to be formed of a material that prevents residue on TiN after etching. The present inventor reached the conclusion on the basis of their committed research findings that Al—Ti is the best material for forming the inclined plane. In addition, it is a powerful tool for preventing hillock generated due to heat treatment that a high melting point metal layer such as Ti or TiN is formed in an upper layer of Al or Al—Ti. The central portion that serves practically as an electrode of a light-emitting device and that connects to a layer containing an organic compound is preferably formed of an anode material having large work function, or a cathode material having a small work function.

One of the constitution of the present invention disclosed in this specification is: a light-emitting device comprising:

a first electrode connected to a thin film transistor formed over a substrate having an insulating surface;

an insulator covering an edge portion of the first electrode;

a layer containing an organic compound formed on the first electrode; and a second electrode formed on the layer containing an organic compound;

wherein the first electrode includes an edge portion comprising a first layer, a second layer, a third layer, and a fourth layer, and a central portion comprising the first layer and the second layer;

the first electrode has an inclined plane between the edge portion and the central portion;

the first layer comprises titanium;

the second layer comprises titanium nitride;

the third layer comprises aluminum or aluminum containing titanium, and the fourth layer comprises titanium.

Another constitution of the present invention disclosed in this specification is: a light-emitting device comprising:

a first electrode connected to a thin film transistor formed over a substrate having an insulating surface;

an insulator covering an edge portion of the first electrode;

a layer containing an organic compound formed on the first electrode; and a second electrode formed on the layer containing an organic compound;

wherein the first electrode includes an edge portion comprising a first layer, a second layer, a third layer, and a fourth layer, and a central portion comprising the first layer and the second layer;

the first electrode has an inclined plane between the edge portion and the central portion;

the inclined plane comprising the third layer and the fourth layer;

the second layer is exposed at a surface of the central portion;

the first layer comprises titanium;

the second layer comprises titanium nitride;

the third layer comprises aluminum or aluminum containing titanium, and the fourth layer comprises titanium.

In the present invention, a light-emitting device according to the present invention, wherein an aspect ratio of irregularities on a surface of the second layer is at most 0.4 and a radius of curvature is at least 300 nm.

An electroluminescent device comprises an anode, a cathode, and a layer containing an organic compound generating luminescence (electroluminescence) by applying an electric field. As luminescence generated in an organic compound, there are luminescence (fluorescence) generated by reverting an excited singlet state to a ground state and luminescence (phosphorescence) generated by reverting an excited triplet state to a ground state. The luminescence radiation is allowed to take place by reverting from either state to the ground state in a light-emitting apparatus manufactured by a fabrication system and a film forming method according to the present invention.

A light-emitting device (electroluminescent device) including a layer containing an organic compound has a structure in which a layer containing an organic compound is interposed between a pair of electrodes. Typically, the layer containing an organic compound has a lamination structure: a hole transportation layer/a light-emitting layer/an electron transportation layer. The structure has extremely high light emission efficiency, and is adopted in almost light-emitting apparatuses that are currently under development.

Further, the structure: an anode/a hole injection layer/a hole transportation layer/a light-emitting layer/an electron transportation layer; or the structure: an anode/a hole injection layer/a hole transportation layer/a light-emitting layer/ an electron transportation layer/an electron injection layer can be adopted. A fluorescent pigment can be doped to the light-emitting layer. All these layers can be formed solely of a low-molecular material, or solely of a polymer material. The term "a layer containing an organic compound" in this specification is a generic term used to refer to all layers interposed between the anode and the cathode. Therefore a layer containing an organic compound includes all the above hole injection layer, the hole transportation layer, the light-emitting layer, the electron transportation layer, and the electron injection layer.

In a light-emitting apparatus according to the present invention, screen display drive is not particularly limited. For example, a dot-sequential driving method, a linear-sequential driving method, a plane-sequential driving method or the like can be employed. Typically, a linear-sequential driving method is employed and a time ratio gray scale driving method or an area ratio gray scale driving method is chosen suitably. A video signal inputted to a source line of the light-emitting apparatus may be an analog signal or a digital signal, and driver circuits and other circuits are designed in accordance with the type of the video signal as appropriate.

BRIEF DESCRIPTION OF THE DRAWINGS

FIGS. 4A and 4B are an explanatory view showing Example 2;

DESCRIPTION OF THE PREFERRED EMBODIMENTS

Hereinafter, an embodiment of the present invention will be explained.

Figure 1A:
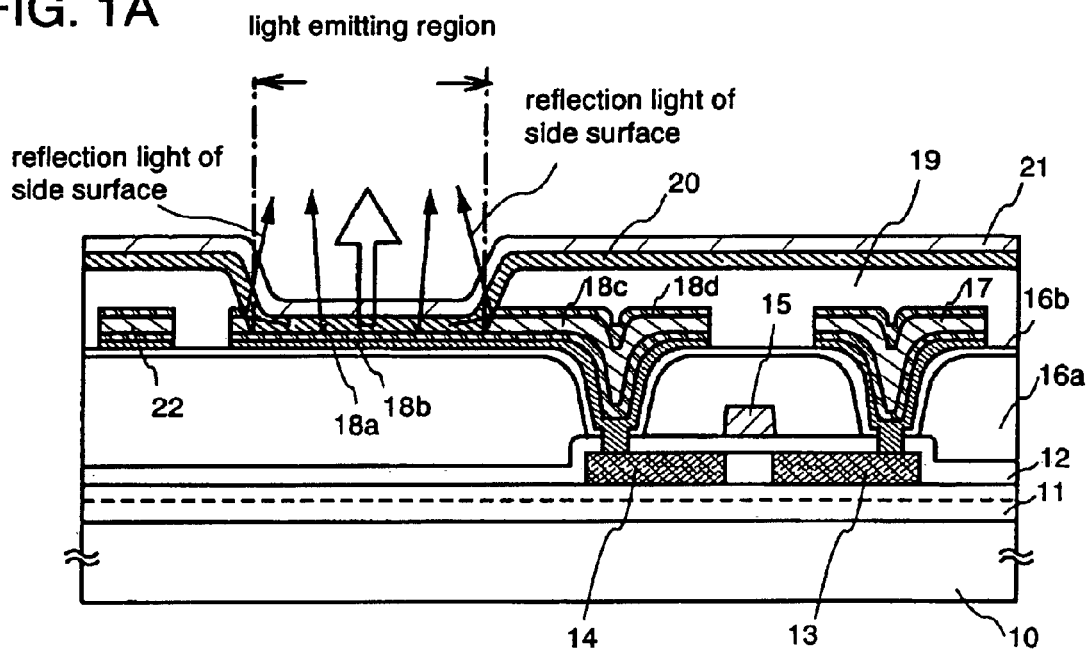
FIGS. 1A and 1B are explanatory views showing Embodiment.

FIG. 1A is a cross-sectional view of an active matrix light-emitting apparatus (a part of one pixel). Hereinafter, a light-emitting device using a layer containing an organic compound formed of a polymer material generating white light emission will be explained as an example.

In FIG. 1A, a TFT (p-channel TFT) provided over a substrate 10 having an insulating surface controls current flowing to a layer containing an organic compound 20 achieving white light emission. Each reference numeral 13 and 14 denotes a source region or a drain region. A base insulating film 11 is formed over the substrate 10 (here, a bottom layer is an nitride insulating film and a top layer is an oxide insulating film). A gate insulating film 12 is formed between a gate electrode 15 and an active layer. Reference numeral 16a denotes an interlayer insulating film formed of an organic material or an inorganic material, and 16b denotes a protective film formed of a silicon nitride film, a silicon nitride oxide film, aluminum nitride, or aluminum nitride oxide. At least one TFT (an n-channel TF or a p-channel TFT) is, but not shown, provided in one pixel. A TFT described here has one channel formation region, but not exclusively, has also plural channel formation regions.

Reference numeral 18 denotes an anode (or a cathode) of the electroluminescent device that comprises a first layer (Ti) 18a, a second layer (TiN) 18b, a third layer (Al or (Al—Ti)), and a fourth layer (Ti) 18d. Reference numeral 21 denotes a second electrode formed of a conductive film, that is, a cathode (or an anode) of the electroluminescent device. Here, the second layer (TiN) 18b connected to the layer containing an organic compound 20 serves as an anode. A power source supply line 17 is formed of the same lamination structure. The lamination structure includes a film containing aluminum as its main components and makes the wiring low resistance. Simultaneously, a source wiring 22 or the like is formed.

To make the layer containing an organic compound 20 generating white light emission, an aqueous solution of poly(ethylene dioxythiophene)/poly(styrene sulfonic acid) (PEDOT/PSS) is coated to the entire surface and baked to form a film that serves as a hole injection layer. Then, a polyvinyl carbazole (PVK) solution doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is coated to the entire surface and baked to form a film that serves as a light-emitting layer. The solvent of PEDOT/PSS is water and PEDOT/PSS is not soluble in an organic solvent. Accordingly, the hole injection layer is in no danger of melting again in case of coating the PEDOT/PSS with PVK. Since the solvents used for PEDOT/PSS and PVK are different each other, separate film formation chambers are preferably used. The layer containing an organic compound 20 may be formed to have a single layer. In this case, a 1,3,4-oxadiazole derivative (PBD) capable of transporting electrons can be dispersed in polyvinyl carbazole (PVK) capable of transporting holes. In addition, white light emission can also be obtained by dispersing 30 wt % of PBD as an electron transporting agent and dispersing four kinds of pigments (TPB, coumarin 6, DCM1, and Nile red) in appropriate amounts.

Alternatively, white light emission can also be obtained by the following, that is, a red light-emitting film containing an organic compound, a green light-emitting film containing an organic compound, and a blue light-emitting film containing an organic compound are appropriately selected, and these films are overlapped each other to mix their color, and then, white light emission can be achieved as a whole.

A $CaF_2$ film is formed by vapor deposition to have a thickness of from 1 to 10 nm as the second electrode 21, and an Al film is formed by sputtering or vapor deposition to have a thickness of approximately 10 nm to make the second electrode serve as the cathode. The cathode should be formed of the material and formed to have the thickness, each of which can transparent to light generated in the layer containing an organic compound 20. In this specification, the term "cathode" refers to not only a single layer formed of a material having a small work function but also a lamination of a thin film formed of a small work function material and a conductive film.

In case of using an Al film to form the second electrode 21, the layer in contact with the layer containing an organic compound 20 can be formed of except oxide. As a result, the reliability of the light-emitting apparatus becomes improved. Instead of the Al film, a transparent conductive film (such as an ITO (indium oxide-tin oxide alloy) film, an $In_2O_3$—ZnO (indium oxide-zinc oxide alloy) film, or a ZnO (zinc oxide) film) can be used for the second electrode 21. A thin metal layer (specifically, an alloy of MgAg, MgIn, or AlLi) can be used instead of $CaF_2$.

The edge of the first electrode 18 is covered by an insulator 19 (also referred to as a bank). In the present invention, the cross-sectional shape of the insulator 19 is important. The concave shape of the first electrode 18 is formed by etching to form the insulator 19. In case that an upper edge portion of the insulator 19 is not curved, a defect that convexity is produced in the upper edge portion of the insulator 19. Therefore, in the present invention, etching treatment is carried out to form the upper edge portion of the insulator 19 to be curved having radius of curvature; to form the third layer 18c (Al or (Al—Ti)) and the fourth layer 18d of the first electrode to be inclined and partially exposed along with the curved insulator 19; and to expose the second layer 18b of the first electrode (TiN) as a light emitting region. The exposed surface of the second layer (TiN) 18b of the first electrode may be leveled. The radius of curvature of the upper edge portion of the insulator 19 is preferably set to from 0.2 to 3 μm. According to the present invention, the layer containing an organic compound and the metal film have excellent coverage. The taper angle of the side face of the insulator 19, and the taper angle of the inclined plane of the third layer (Al or (Al—Ti)) 18c and the fourth layer (Ti) 18d of the first electrode is preferably set to 45°±10°.

According to the present invention, light emitted from the layer containing an organic compound 20 is reflected at the inclined plane of the third layer (Al or (Al—Ti)) 18c and the fourth layer (Ti) 18d of the first electrode to increase the total amount of light extracted in the direction indicated by the arrow in FIG. 1A.

Figure 1B:
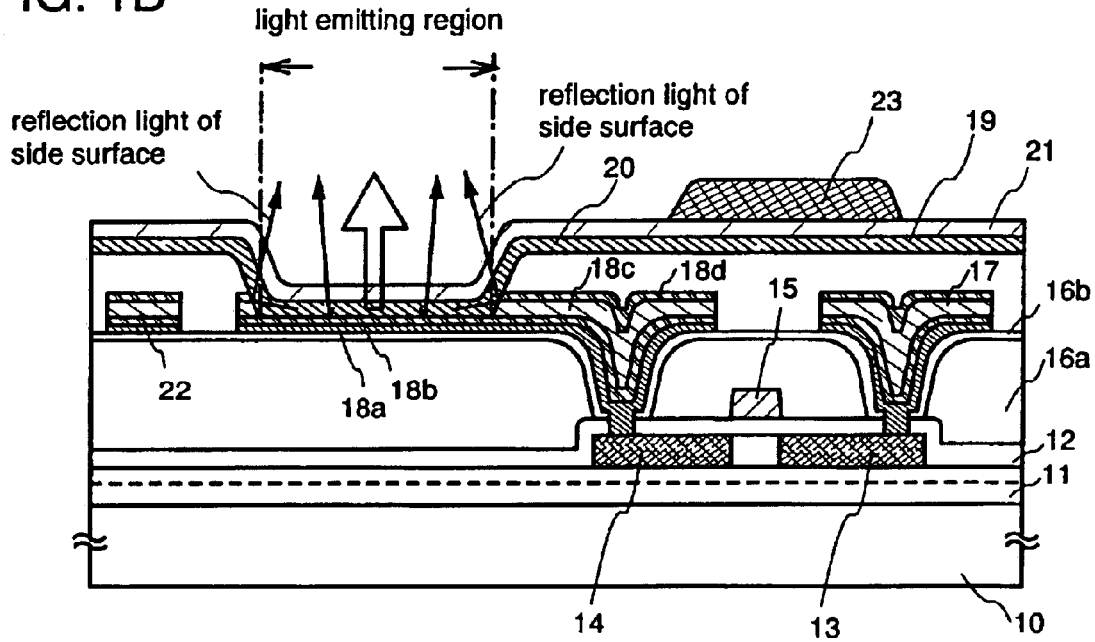

As shown in FIG. 1B, an auxiliary electrode 23 may be provided over the conductive film (cathode) 21 in order to lower the resistance of the conductive film (cathode) 21. The auxiliary electrode 23 is selectively formed by vapor deposition using an evaporation mask.

Although not shown in the drawing, a protective film is preferably formed over the second electrode 21 in order to enhance the reliability of the light-emitting apparatus. This protective film is an insulating film which mainly contains silicon nitride or silicon nitride oxide formed by sputtering (the DC method or the RF method), or a thin film which mainly contains carbon. A silicon nitride film can be formed in the atmosphere containing nitrogen and argon using a silicon target. A silicon nitride target may be used instead of the silicon target. The protective film may also be formed by film formation system using remote plasma. The thickness of the protective film is preferably formed to be thin as much as possible to pass light emission.

In the present invention, the thin film containing carbon as its main components is formed of a DLC (Diamond like Carbon) film having a thickness of from 3 to 50 nm. The DLC film has $SP^3$ bond as a bond among carbon atoms in a short distance order, however, the DLC film has macroscopically an amorphous structure. The composition of the DLC film is carbon of from 70 to 95 atomic % and hydrogen of from 5 to 30 atomic %. The DLC film is very hard and excellent in insulating performance. Such a DLC film has low permeability of gas such as steam or oxygen. Further, it is known that the DLC film has hardness of from 15 to 25 GPa by measurement of a very small hardness tester.

The DLC film can be formed by plasma CVD (typically, RF plasma CVD, microwave CVD, electron cyclotron resonance (ECR) CVD), or sputtering. The DLC film can be formed with excellent adherence by any one of the above film forming methods. The DLC film is formed by placing a substrate at a cathode. Further, the DLC film can be formed to be dense and hard by applying negative bias to utilize some degree of ion bombardment.

As reaction gas used for forming a film, hydrogen gas and hydrocarbon gas (for example, $CH_4$, $C_2H_2$, $C_6H_6$, or the like) are used. The reaction gas is ionized by glow discharge. The ions are accelerated to clash with a cathode applied with negative self bias. Then, a dense and smooth DLC film can be formed. Further, the DLC film is an insulating film which is transparent or semitransparent to visible light. In the specification, the term used herein "transparent to visible light" refers that transmittance of visible light is from 80 to 100% and the term used herein "semitransparent to visible light" refers that transmittance of visible light is from 50 to 80%.

Further, the top gate type TFT is taken as an example here, but the invention is applicable regardless of the TFT structure, for example, a bottom gate type (inverse stagger type) TFT or a forward stagger type TFT.

EXAMPLES

Example 1

Hereinafter, a brief description of an example of procedure of forming a light-emitting device in accordance with the present invention is explained with reference to FIGS. 2A to 3C in this example.

First, a base insulating film 31 is deposited over a substrate 30 which has an insulating surface.

A silicon oxynitride film is deposited as the first layer of the base insulating film to have a thickness of from 10 to 200 nm (preferably, from 50 to 100 nm) by plasma CVD using reaction gas of $SiH_4$, $NH_3$, and $N_2O$. Here, a silicon oxynitride film (composition ratio: Si=32%, O=27%, N=24%, H=17%) with a thickness of 50 nm is deposited. A silicon oxynitride film is deposited as the second layer of the base insulating film to have a thickness of form 50 to 200 nm (preferably, from 100 to 150 nm) by plasma CVD using as reaction gas of $SiH_4$ and $N_2O$. Here, a silicon oxynitride film (composition ratio: Si=32%, O=59%, N=7%, H=2%) with a thickness of 100 nm is formed. The base insulating film 31 in this example is formed to have two layers, but can be formed to have a single layer or a laminated layer having more than two layers of the above insulating films.

A semiconductor layer is deposited over the base insulating film. The semiconductor layer is formed as follows: an amorphous semiconductor film is deposited by a known means (a sputtering, an LPCVD, a plasma CVD, or the like), then, the film is crystallized by a known crystallization method (a laser crystallization method, a thermal crystallization method, or a thermal crystallization method using a catalyst such as nickel), and then, the crystalline semiconductor film is patterned into a desired form. The thickness of the semiconductor layer is from 25 to 80 nm (preferably, from 30 to 60 nm). The material of the crystalline semiconductor film is, but not exclusively, preferably silicon or a silicon-germanium alloy.

In case of forming a crystalline semiconductor film by a laser crystallization method, it is possible to use an excimer laser, a YAG laser, or an $YVO_4$ laser of a pulse-oscillation or continuous-oscillation type. In case of using such lasers, laser light from a laser oscillator is preferably emitted to the semiconductor film by condensing into a linear shape by an optical system. The condition of crystallization is appropriately selected by those who implement the invention. In case of using an excimer laser, pulse oscillation frequency is 30 Hz and laser energy density is from 100 to 400 mJ/cm$^2$ (typically, from 200 to 300 mJ/cm$^2$). Meanwhile, in case of using a YAG laser, the second harmonic is preferably used, pulse oscillation frequency is from 1 to 10 kHz, and laser energy density is from 300 to 600 mJ/cm$^2$ (typically, from 350 to 500 mJ/cm$^2$). The laser light condensed into a linear shape with a width of from 100 to 1000 μm, e.g. 400 μm, is emitted throughout the substrate, while being the overlap ratio of the linear laser light from 80 to 98%.

Then, the surface of the semiconductor layer is cleaned by an etchant containing a hydrogen fluoride, and a gate insulating film 33 covering the semiconductor layer is formed. The gate insulating film 33 is formed by depositing an insulating film containing silicon to have a thickness of from 40 to 150 nm by plasma CVD or sputtering. In this example, a silicon oxide nitride film is deposited (composition ratio: Si=32%, O=59%, N=7% and H=2%) to have a thickness of 115 nm by plasma CVD. Of course, the gate insulating film is not limited to a silicon oxide nitride film but may be formed by another insulating films in a single layer or a laminated layer.

After cleaning the surface of the gate insulating film 33, a gate electrode is formed.

Then, a p-type providing impurity element (such as B), herein, adequate amounts of boron are added to the semiconductor to form a source region and a drain region 32. After the addition of the impurity element, heat-treatment, irradiation of intense light, or irradiation of laser light is carried out in order to activate the impurity element. Simultaneously with the activation, plasma damage of the gate insulating film or of the boundary face between the gate insulating film and the semiconductor layer can be repaired. Particularly, it is extremely effective to irradiate the main or the back surface with the second harmonic YAG laser to activate the impurity element in the atmosphere at from room temperature to 300° C. YAG laser is a preferable activating means since it requires a few maintenances.

The subsequent processes are carried out as follows: an interlayer insulating film 35 is formed of an organic or inorganic material (including a coated silicon oxide film, PSG (phosphorus-doped glass), BPSG (glass doped with boron and phosphorus), or the like), the semiconductor layer is hydrogenated, and contact holes reaching the source region or drain region are formed. Then, a source electrode (wiring) and a first electrode (drain electrode) 36 are formed, and the TFT (p-channel TFT) is completed.

Although a p-channel TFT is taken as an example in this example, an n-type impurity element (such as P or As) can be used instead of a p-type impurity element to form the p-channel TFT.

A top gate TFT is taken as an example in this example. However, the present invention is applicable to any TFT structure. For instance, the invention can be applied to a bottom gate (reverse stagger) TFT and a forward stagger TFT.

Figure 3A:
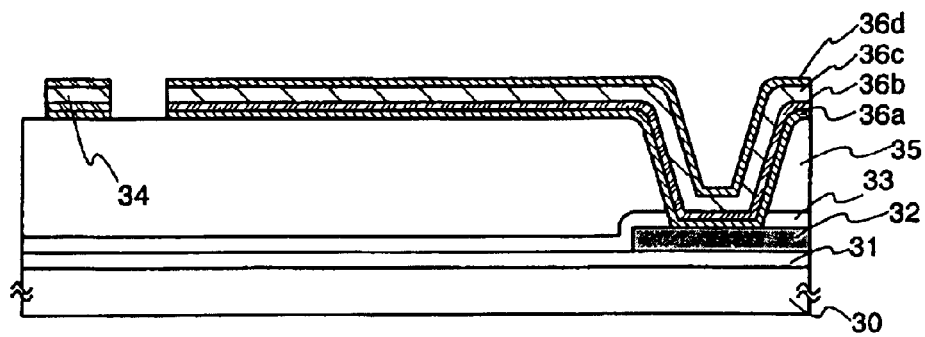
FIGS. 3A to 3C are explanatory views showing Example 1.

With the above described processes, TFT (the drain region 32 is only shown), the gate insulating film 33, the interlayer insulating film 35, the first electrode 36 (a first layer (Ti) 36a, a second layer (TiN) 36b, a third layer (Al—Ti) 36c, and a fourth layer (Ti) 36d) are formed (FIG. 3A).

Particularly, in the first electrode 36 which is contact with the drain region 32, the lower layer 36a of the first electrode is preferably formed of Ti that can make an ohmic contact with silicon to have a thickness of from 10 to 100 nm. As the material for forming the second layer 36b of the first electrode, TiN which has a large work function is preferably used in case of using the first electrode as an anode, and the second layer 36b is formed to have a thickness of from 10 to 100 nm. As the material for forming the third layer 36c of the first electrode, a metal material which reflects light, typically, a metal material containing Al or Ag as its main components is preferably used, and the third layer is formed to have a thickness of from 100 to 600 nm. In this example, Al—Ti (Ti: 1%) is used. The fourth layer 36b of the first electrode also functions as a blocking layer for preventing the third layers 36c and the first layer 36a of the first electrode from forming into an alloy. As the material for forming the fourth layer 36d, Ti, TiN, or the like that can prevent oxidization, corrosion, or hillock of the third layer 36c is preferably used, and the fourth layer is formed to have a thickness of from 20 to 100 nm by a known method such as sputtering. In this example, Ti is used.

The first electrodes 36a to 36d can be formed simultaneously with forming other wirings, for example, a source wiring 34 and a power supplying line. Accordingly, the process requires a few photomasks (seven masks in total: a mask for patterning the semiconductor layer (Mask 1), a mask for patterning the gate wiring (Mask 2), a mask for doping selectively an n-type impurity element (Mask 3), a mask for doping selectively a p-type impurity element (Mask 4), a mask for forming contact holes that reach the semiconductor layer (Mask 5), a mask for patterning the first electrode, the source wiring, and the power supplying line (Mask 6), and a mask for forming an insulator (Mask 7)). Conventionally, the first electrode is formed over the layer that is another layer over which the source wiring and the power supplying line are formed. Consequently, a mask for forming only the first electrode is required, so that the requiring number of masks is 8 in total. When the layers 36a to 36d of the first electrode and the wirings are simultaneously formed, it is desirable that the electrical resistivity as a wiring is low in total.

Figure 3B:
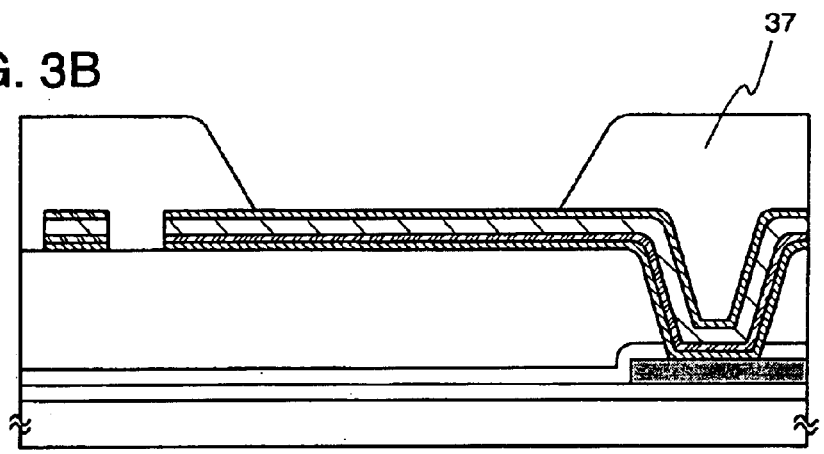

Next, the insulator (referred to as a bank) is formed to cover the edge of the first electrode (and a portion that is in contact with the drain region 32) (FIG. 3B). The insulator can be formed of inorganic materials (such as silicon oxide, silicon nitride, and silicon oxynitride) and photosensitive or non-photosensitive organic materials (such as polyimide, acrylic, polyamide, polyimideamide, resist, and benzocyclobutene), or a lamination layer formed of these materials. Photosensitive organic resin is used in this example. For instance, in case that the positive photosensitive acrylic is used as the material for forming the insulator, only an upper edge portion of the insulator is preferably formed to have a curved surface with a radius of curvature. Both a negative photosensitive material which becomes insoluble in an etchant under photosensitive light and a positive photosensitive material which becomes soluble in an etchant under light can be used for the insulator.

Figure 3C:
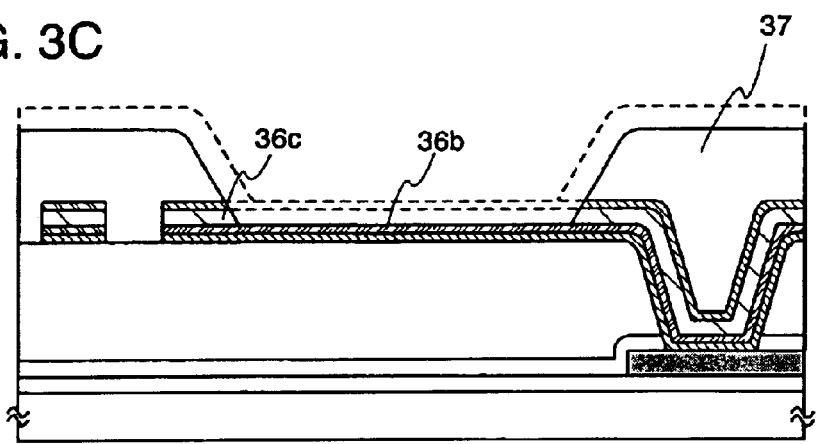

A part of the third layer (Al—Ti) 36c and the fourth layer (Ti) 36d of the first electrode are removed, while etching the insulator 37 as in FIG. 3C. It is important that the exposed surface of the third layer 36c is etched so as to have an inclined plane and the exposed surface of the second layer (TiN) 36b is etched so as to be flat. Dry etching or wet etching can be carried out at once or at several times in the condition that the etching ratio between the second layer (TiN) 36b and the third layer (Al—Ti) 36c is large. The final radius of curvature of the upper edge portion of the insulator is preferably from 0.2 to 3 µm. The angle of the inclined plane of the first electrode (the angle of inclination or taper angle) is more than 30° and less than 70°. The inclined plane reflects light generated in a layer containing an organic compound which will be formed in a later process.

By forming the first electrode having the lamination structure: the first layer (Ti) 36a/the second layer (TiN) 36b/the third layer (Al—Ti) 36c/the fourth layer (Ti) 36d, etching residue becomes hardly remained over the exposed surface of the second layer (TiN) 36b during forming the inclined plane of the third layer (Al—Ti) 36c and the fourth layer (Ti) 36d by etching the third layer (Al—Ti) 36c and the fourth layer (Ti) 36d. The etching residue may be resulted to problems such as poor coverage, short-circuiting, or quenching. The lamination structure of the first electrode according to the present invention can prevent these problems greatly.

Next, a layer containing an organic compound 38 is formed by vapor deposition or coating. In case of carrying out vapor deposition, a film forming chamber is vacuum-exhausted to at most $5 \times 10^{-3}$ Torr (0.665 Pa), preferably from $10^{-4}$ to $10^{-6}$ Pa. The organic compound is preliminarily vaporized by resistance heating for the vapor deposition.

The vaporized organic compound scatters in the direction of the substrate upon opening the shutter for deposition. The vaporized organic compound are scattered upward, and are deposited over the substrate passing through an opening portion provided with a metal mask. A light-emitting device that achieves white light emission as a whole can be formed by stacking a layer containing an organic compound.

For instance, white light emission can be achieved by stacking sequentially an $Alq_3$ film, an $Alq_3$ film partially doped with Nile red which is a red light emitting pigment, a p-EtTAZ film, and a TPD (aromatic diamine) film.

On the other hand, in case of forming the layer containing an organic compound by spin coating, the coated layer is preferably baked by vacuum heating. For example, an aqueous solution (PEDOT/PSS) of poly(ethylene dioxythiophene)/poly(styrene sulfonic acid) may be coated to the entire surface and baked to form a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be coated to the entire surface and baked to form a light-emitting layer.

The layer containing an organic compound is formed to have a lamination structure in the above example, but can be formed to have a single layer structure. For instance, a 1,3,4-oxadiazole derivative (PBD) capable of transporting electrons can be dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts. Also, the layer containing an organic compound can be formed by stacking a layer formed of high molecular weight material and layer formed of low molecular weight materials.

Figure 2A:
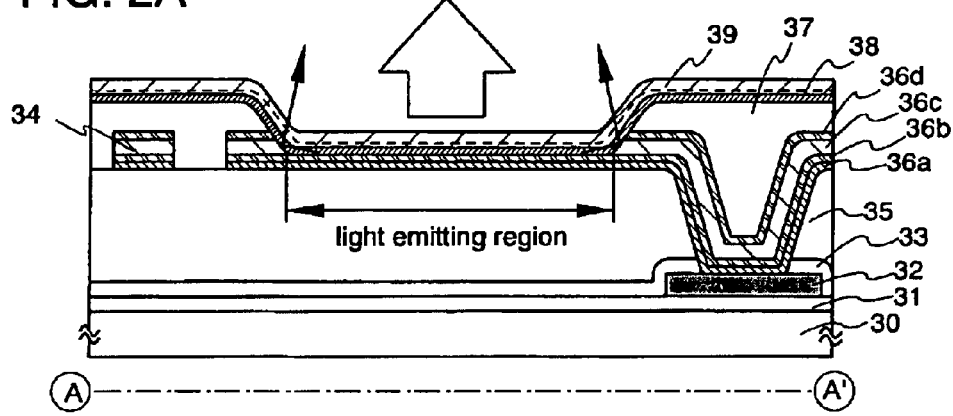
FIGS. 2A and 2B are explanatory views showing Example 1.
Figure 2B:
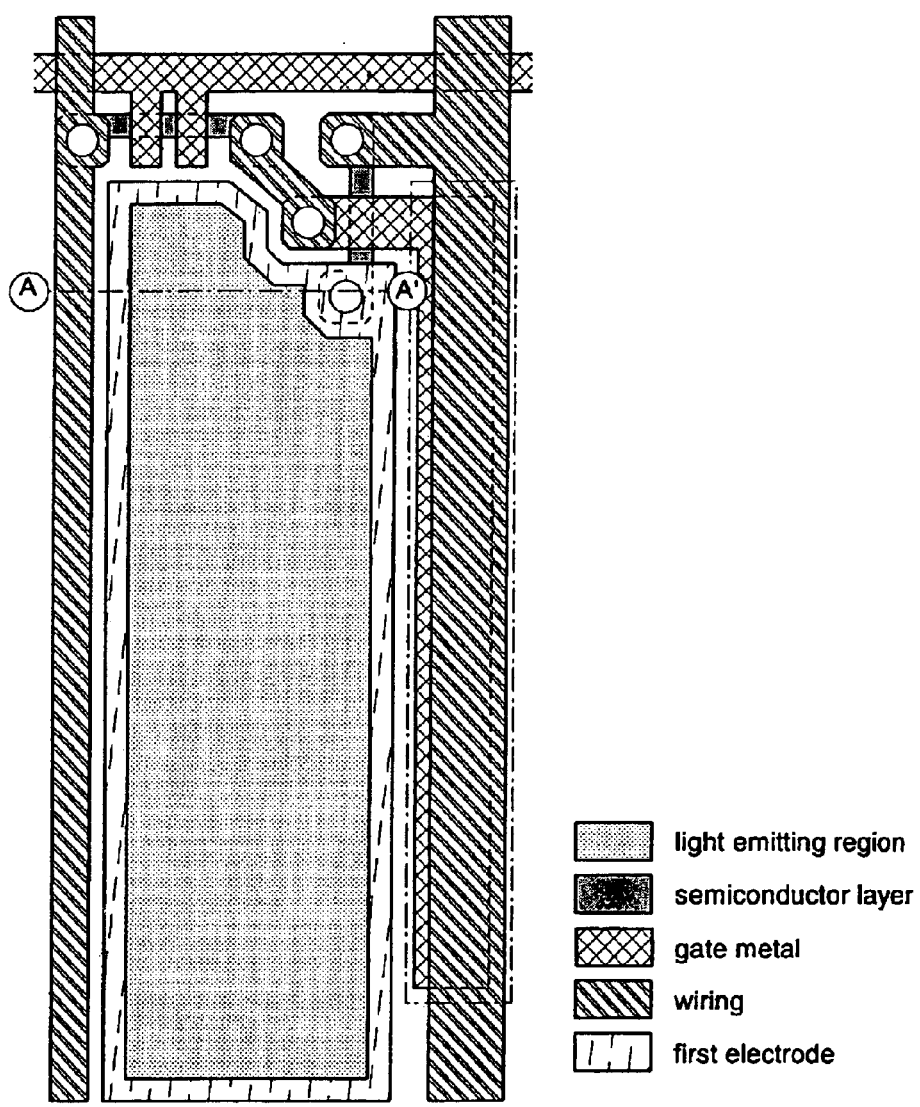

Next, a thin film containing a metal having a small work function (a film formed of an alloy such as MgAg, MgIn, AlLi, $CaF_2$, or CaN or an element belonging to Group 1 or 2 in the periodic table, and aluminum by co-evaporation) is formed, and a thin conductive film (an aluminum film here) 39 is stacked thereon by vapor deposition (FIG. 2B). An aluminum film has high capability for blocking moisture and oxygen and therefore is preferably used for the material of the conductive film 39 for improvement of the reliability of the light-emitting apparatus. FIG. 2B is a cross-sectional view of the FIG. 2A taken along the line A–A'. The lamination film is thin enough to pass light and serves as a cathode in this example. Instead of a thin conductive film, a transparent conductive film (such as an ITO (indium oxide-tin oxide alloy) film, an ITSO (ITO mixed with silicon oxide) an $In_2O_3$—ZnO (indium oxide-zinc oxide alloy) film, a ZnO (zinc oxide) film), or the like) can be used. An auxiliary electrode may be formed over the conductive film 39 in order to lower the resistance of the cathode. The cathode is formed selectively by resistance heating during vapor deposition using an evaporation mask.

The obtained light-emitting device emits white light in the direction indicated by the arrow in FIG. 2B. The inclined plane of the third layer 36c of the first electrode reflects light emitted in the lateral direction, thereby increasing the amount of light emitted in the arrow direction.

After forming the second electrode (conductive film 39), the light-emitting device formed over the substrate 30 is sealed by bonding a sealing substrate (transparent substrate) using a seal agent. Spacers formed of a resin film may be provided in order to keep the distance between the sealing substrate and the light-emitting device. The space surrounded by the seal agent is filled with inert gas such as nitrogen. As the material for the seal agent, an epoxy-based resin is preferably used. It is desirable that the material of the first seal agent transmits as little moisture and oxygen as possible. A substance having the effect of absorbing oxygen and moisture (e.g., drying agent) may be placed in the space surrounded by the seal agent.

By enclosing the light-emitting device in a space as above, the light-emitting device can be completely shielded against the outside, and external substances that cause degradation of the layer containing an organic compound such as moisture and oxygen can be prevented from penetrating into the light-emitting device. Accordingly, a highly reliable light-emitting apparatus can be obtained.

Example 2

The state of a residue generated due to etching for forming steps of a first electrode will be described with reference to experimental results. As shown in FIGS. 4A and 4B, the first electrode is classified broadly into type 1 (without a fourth layer) and type 2 (with a fourth layer) by the state of lamination, respectively. The state of an etched third layer that is formed of another material is observed. The first and the second layers are formed of common materials, the first layer is formed of Ti, and the second layer is formed of TiN. In case of forming the fourth layer, Ti is used for forming the fourth layer. The fourth layer is formed of Ti in this example, but can also be formed of TiN.

The sample that is used for observing an etching residue is made by forming silicon nitride over a glass substrate and forming a quasi electrode having a lamination structure that serves as the first electrode. A metal film that serves as the first to the fourth layers is formed, coated with positive acrylic as in Example 1, patterned, developed, and exposed the electrode surface. Thereafter, the sample is heat-treated at 220° C. for 1 hour, and etched, then, observed the state of the metal layer.

FIGS. 7A to 13B are views showing experimental results. In each views, (A) is a SEM image and (B) is a view showing clearly what the exposed surface is. All electrodes are formed by sputtering. As used herein, the term "target" refers to the target which is used for sputtering.

Figure 7A:
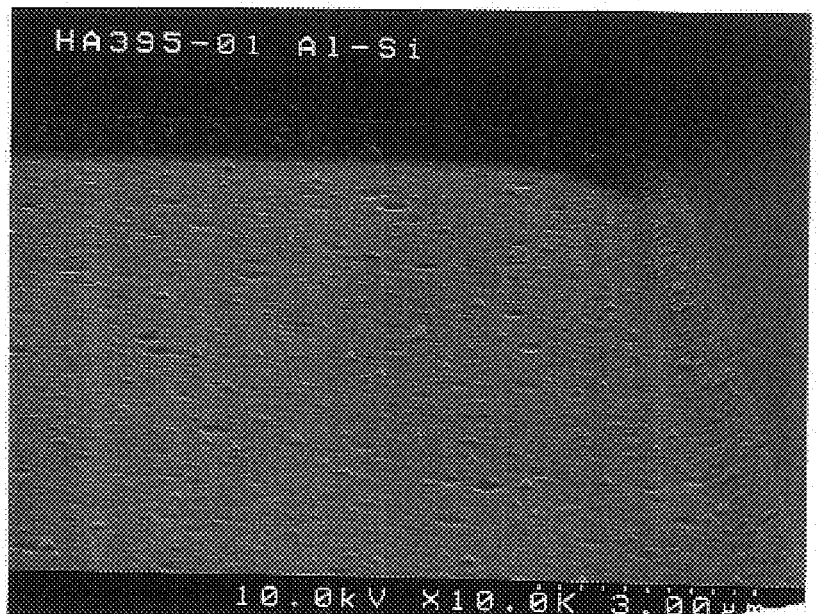
FIGS. 7A and 7B are SEM images showing a surface after etching (Ti/TiN/Al—Si)
Figure 7B:
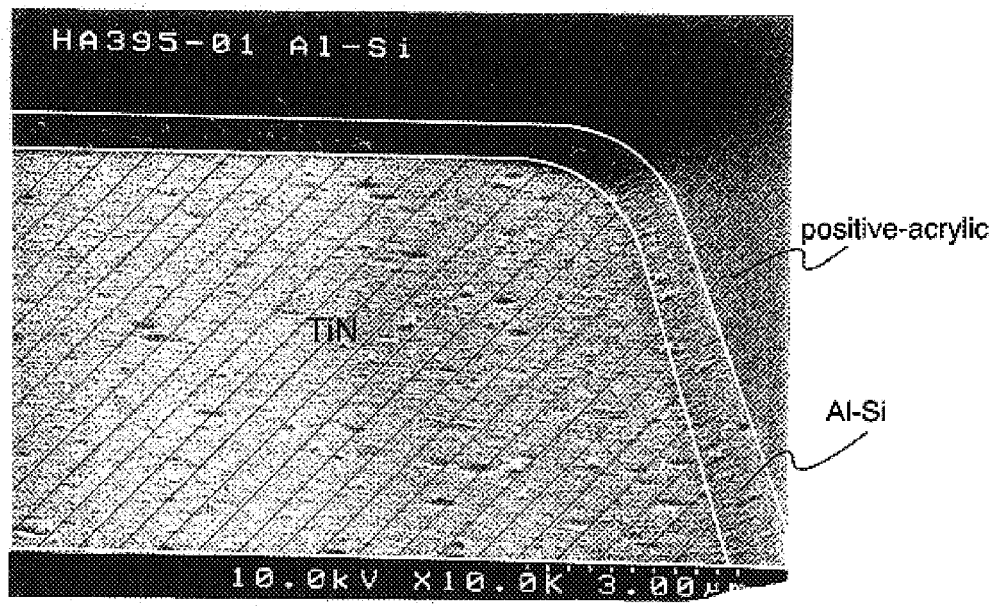
Figure 8A:
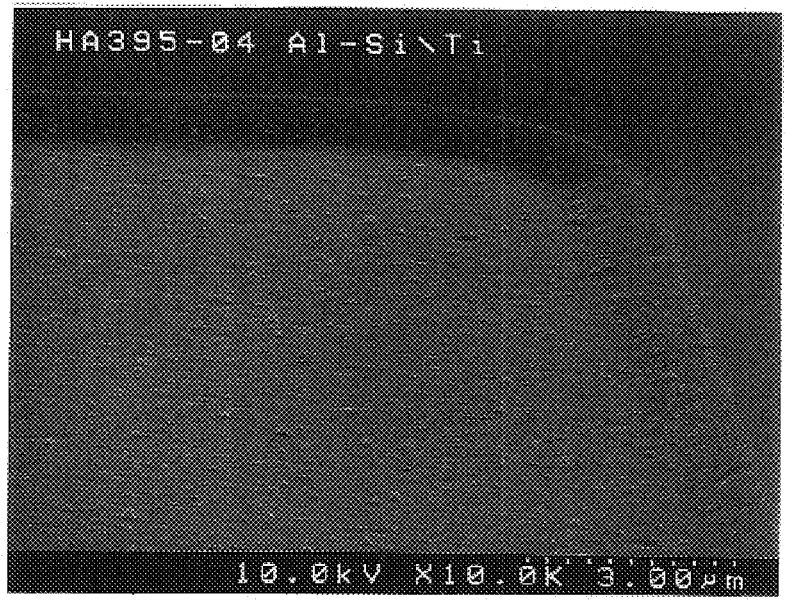
FIGS. 8A and 8B are SEM images showing a surface after etching (Ti/TiN/Al—Si/Ti)
Figure 8B:
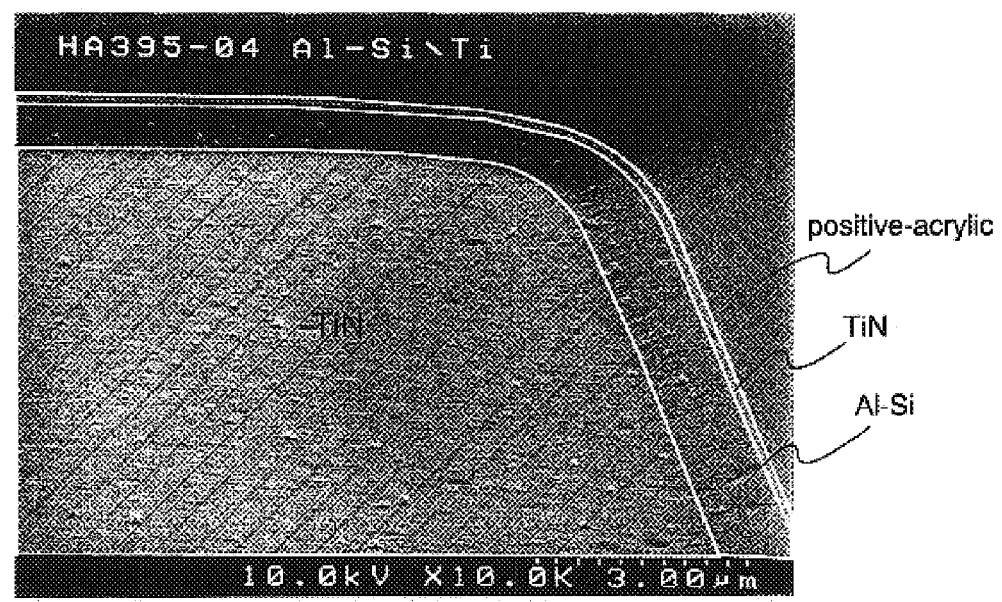
Figure 9A:
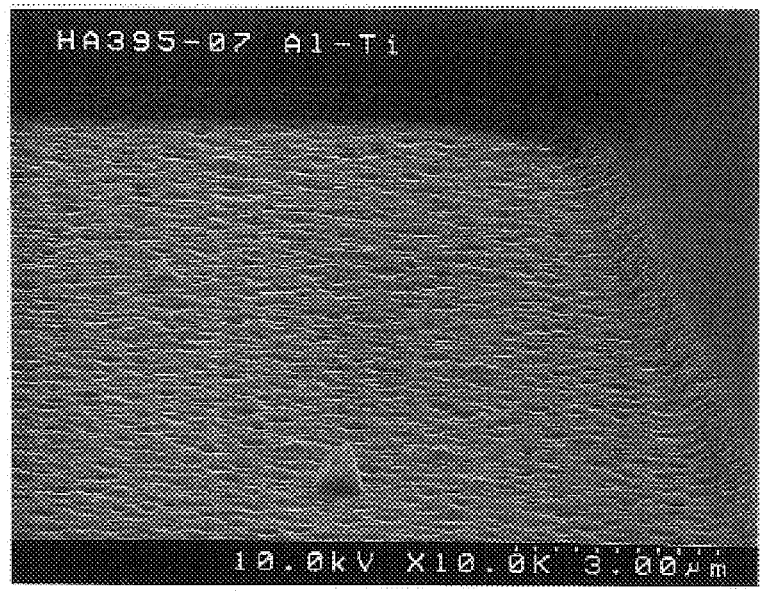
FIGS. 9A and 9B are SEM images showing a surface after etching (Ti/TiN/Al—Ti)
Figure 9B:
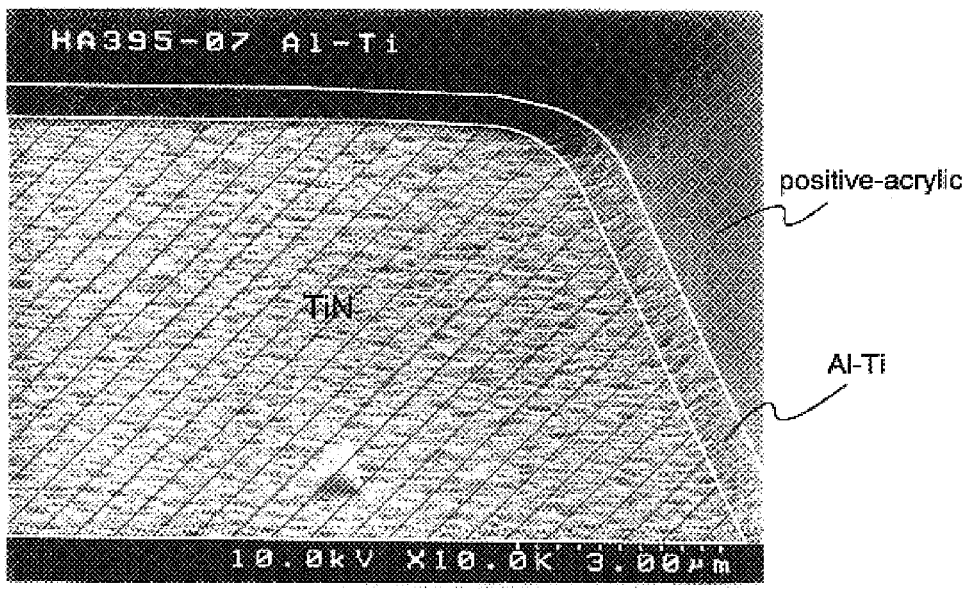
Figure 10A:
FIGS. 10A and 10B are SEM images showing a surface after etching (Ti/TiN/Al—Ti/Ti)
Figure 10B:
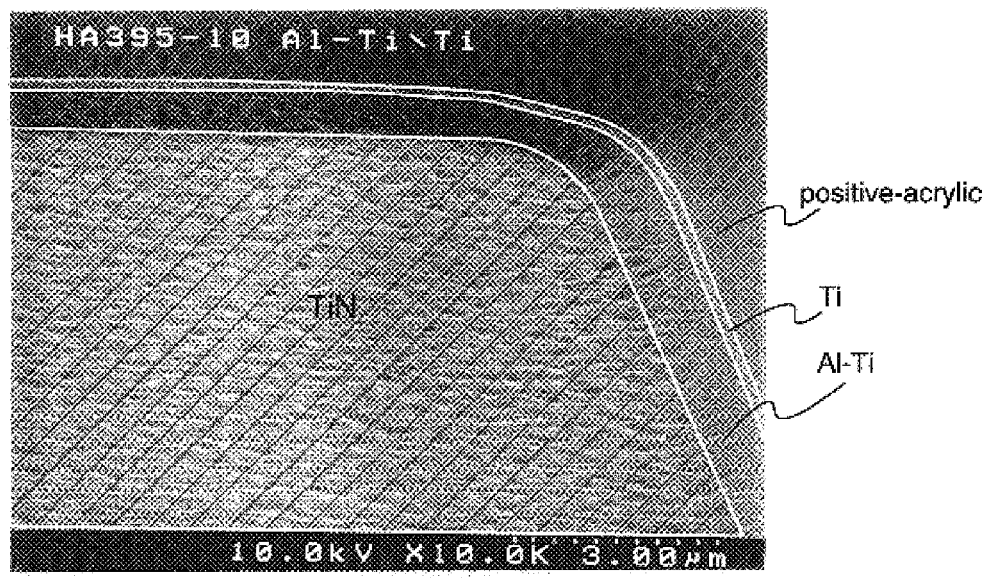
Figure 11A:
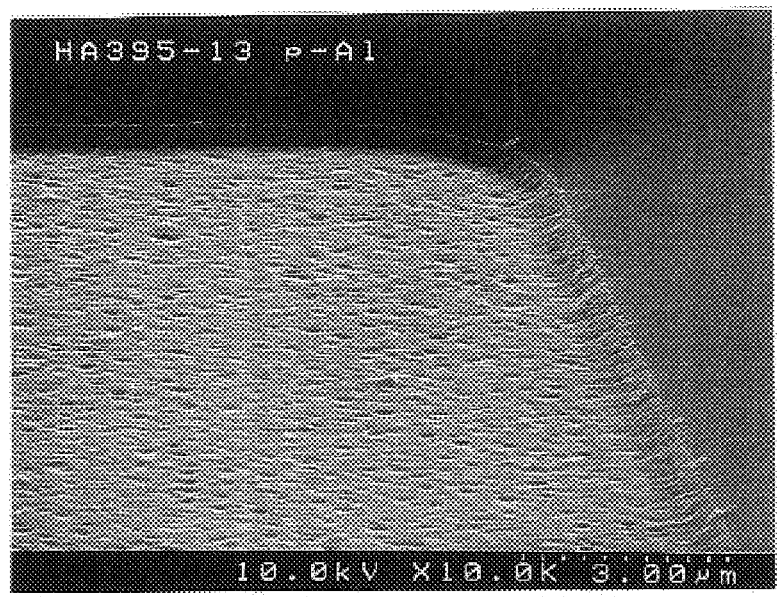
FIGS. 11A and 11B are SEM images showing a surface after etching (Ti/TiN/Al)
Figure 11B:
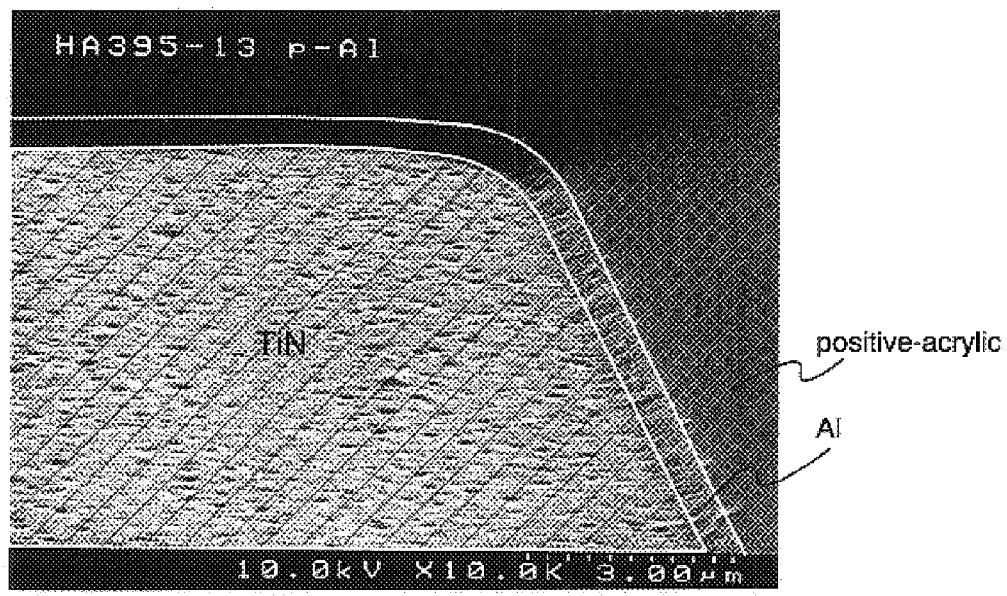
Figure 12A:
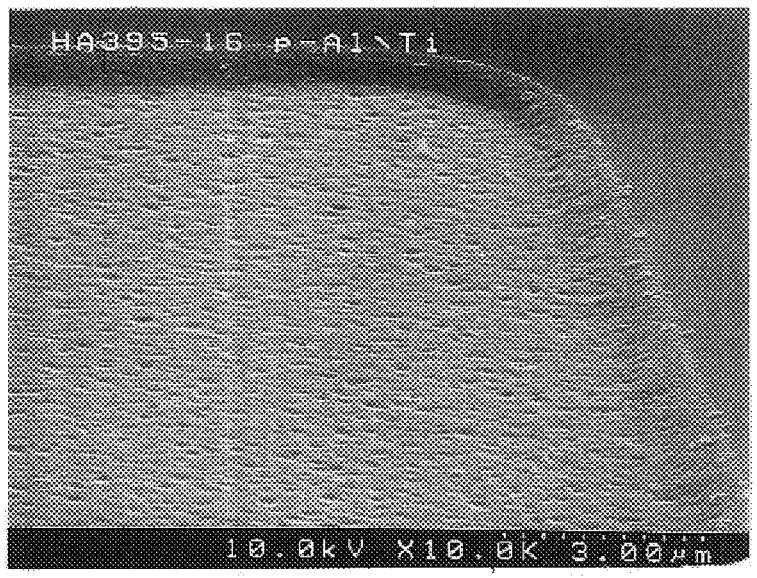
FIGS. 12A and 12B are SEM images showing a surface after etching (Ti/TiN/Al/Ti (1))
Figure 12B:
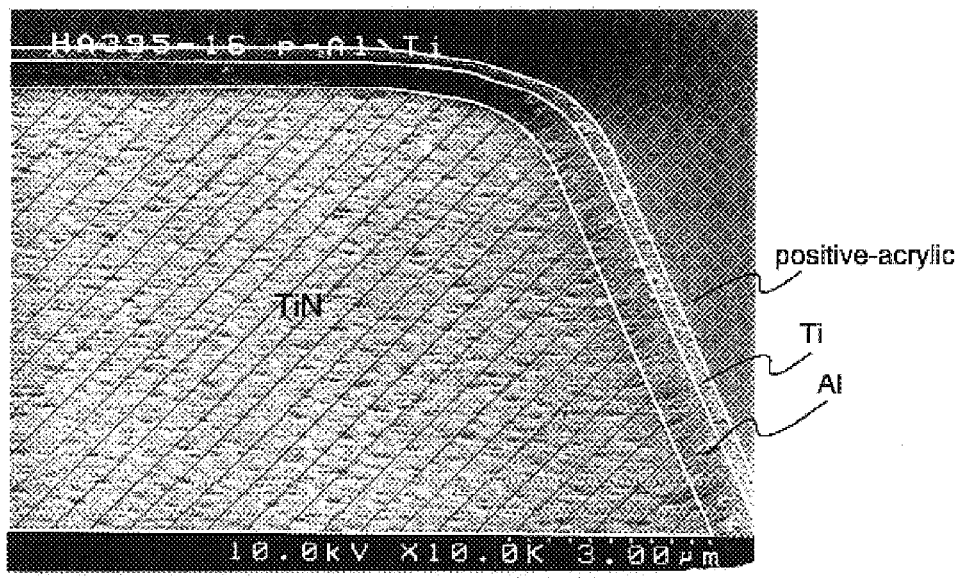
Figure 13A:
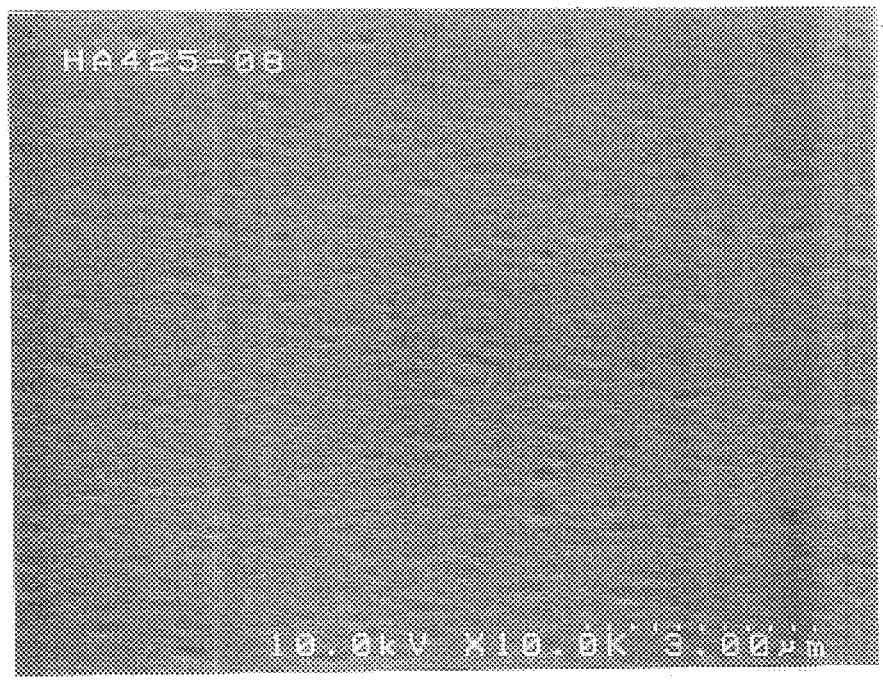
FIGS. 13A and 13B are SEM images showing a surface after etching (Ti/TiN/Al/Ti (2)).
Figure 13B:
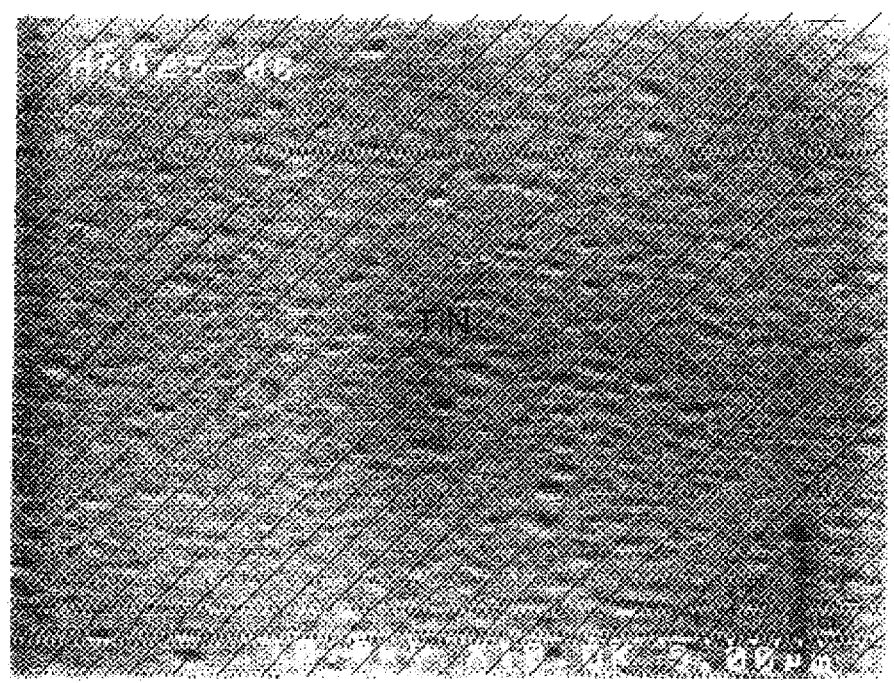

FIGS. 7A and 7B show the third layer without the fourth layer including residue, which is formed of aluminum containing silicon (hereinafter, Al—Si) (target: Al-2% Si) (Ti/TiN/Al—Si). FIGS. 8A and 8B show the third layer with the fourth layer including residue, which is formed by using Al—Si (target: Al-2% Si) (Ti/TiN/Al—Si/Ti). FIGS. 9A and 9B show the third layer without the fourth layer including residue, which is formed by using Al—Ti (target: Al-1% Ti) (Ti/TiN/Al—Ti). FIGS. 10A and 10B show the third layer with the fourth layer including residue, which is formed by using Al—Ti (target: Al-1% Ti) (Ti/TiN/Al—Ti/Ti). FIGS. 11A and 11B are formed as the third layer without the fourth layer including residue by using Al (target: pure-Al) (Ti/TiN/Al). FIGS. 12A and 12B are the third layer with the fourth layer including residue, which is formed by using Al (target: pure-Al) (Ti/TiN/Al Ti(1)). FIGS. 13A and 13B show the third layer with the fourth layer including no residue, which is formed by using Al (target: pure-Al) (Ti/TiN/Al Ti(2)). The shooting angle of SEM image in FIG. 13 is slightly different from other images since the shooting date is different from those of other images, however, there is no problem in observation of the state of surfaces. Table 1 shows the result of the observation of the state of surfaces of each sample.

TABLE 1

| Sample | 4th layer | residue | possible factor |
|---|---|---|---|
| Ti/TiN/Al—Si | without | with | hillock due to heat treatment, etching speed |
| Ti/TiN/Al—Si/Ti | with | with | etching speed |
| Ti/TiN/Al—Ti | without | with | hillock due to heat treatment |
| Ti/TiN/Al—Ti/Ti | with | without | nothing |
| Ti/TiN/Al | without | with | hillock due to heat treatment, irregularity in film formation |
| Ti/TiN/Al/Ti(1)* | with | with | irregularity in film formation |
| Ti/TiN/Al/Ti(2)* | with | without* | nothing |

*It depends on film formation apparatuses.

Three major factors characterize an etching residue: hillock generated during heat treatment; difference in etching rates of solid solution elements; and irregularities generated at film formation.

The hillock generated during heat treatment causes problems in heat treatment of the state that a metal weak against heat is exposed. A convexity referred to as hillock may be generated due to heat treatment of a metal that is weak against heat. In case of existing hillock in the third layer, an etching residue is remained due to the convexity of the hillock even if removing the third layer by etching to expose the second layer. The hillock may be prevented by forming the fourth layer formed of high melting point metal over the third layer. In this experiment, residues are existed in (Ti/TiN/Al (FIGS. 11A and 11B)), (Ti/TiN/Al—Si (FIGS. 7A and 7B)), and (Ti/TiN/Al—Ti (FIGS. 9A and 9B)) due to the hillock.

The difference in etching rates of solid solution elements may be seen in the case of using the solid solution for the third layer as typified by Al and Si, which is solved but not reacted to form compounds, in which each component has a property as a simple substance. In such a case, an etching rate with respect to a certain etching method is depending on each element. Therefore, the etching rates are different depending on each etching position, and the fact causes generating an etching residue. Taken Al—Si as an example, since the etching rate of Si is later than that of Al, Si in Al serves as a mask, consequently, etching residue is generated (Ti/TiN/Al—Si (FIGS. 7A and 7B)) and (Ti/TiN/Al—Si/Ti (FIGS. 8A and 8B)). Tests by the inventor have shown that that more amounts of residue is generated if heat treatment is further carried out.

The surface shape after etching reflects irregularities generated at film formation. In this experiment, residues are existed in (Ti/TiN/Al (FIGS. 11A and 11B)) and (Ti/TiN/Al Ti(1) (FIGS. 12A and 12B)) due to the irregularities. With respect to the electrode structure of Ti/TiN/Al/Ti, etching residues are not generated when etching is carried out by different equipment for forming an Al film at a later date (FIG. 13).

Hereby, the electrode structure of (Ti/TiN/Al—Ti/Ti) of FIGS. 10A and 10B and (Ti/TiN/Al/Ti) (which makes it a condition that convexity is not generated at film formation) are the best structure for preventing deterioration and an etching residue due to an etching for forming steps of the first electrode. In such electrode structure, deterioration due to an etching residue is hardly caused even when the first electrode is formed to have an inclined plane for reflecting light emitted in the lateral direction. Here, the fourth layer can be formed of TiN.

It is realized that a multiplicity of extreme shallow concavities is generated on TiN surface of the first electrode having the structure of (Ti/TiN/Al—Ti/Ti) and (Ti/TiN/Al/Ti) according to careful observation. Since the concavity is generated by forming an inclined plane for reflecting light and etching to expose TiN, there is no concavity on the TiN surface that is not etched. It is known that such concavity does not prevent light generated in a layer containing organic compound.

According to the above experimental results and considerations, the first electrode has preferably the lamination structure composed of Ti of the first layer, TiN of the second layer, Al or Al—Ti of the third layer, and Ti of the fourth layer. Adopting such structure makes it possible to prevent etching residue during forming an inclined plane for reflecting light, and defects such as short-circuiting and poor coverage of an organic compound layer formed in an upper portion. Thus, yield is improved since deterioration is prevented.

Example 3

Observation using an atomic force microscope (AFM) is carried out to the TiN surface state of a quasi electrode sample (state 1: Ti/TiN/Al—Ti/Ti) without a residue, of which the inclined plane is formed by adopting the lamination structure according to the present invention; and the TiN surface state of a quasi electrode sample (state 2: Ti/TiN/Al—Si/Ti) with residue, which is not formed by adopting the lamination structure according to the present invention. The cross-sectional surfaces of the sample of state 1 and the sample of state 2 are observed to obtain the radius of curvature of irregularities by transmission electron microscope (TEM). A portion having small radius of curvature that may have an effect on light emission of an organic light-emitting layer is particularly measured since a portion having large radius of curvature is nearly a flat surface.

An aspect ratio of irregularities is obtained by height and distance between a peak and an adjacent valley in a graph of AFM. If there is an irregularity having large aspect ratio that is beyond the bounds of permissibility, deterioration is caused by the irregularity. Based on the fact, four or five of aspect ratios that are large in value are measured.

Roughness average (Ra), peak to valley (P-V), radius of curvature, and aspect ratio, which are parameter showing each state of surface, are shown in Table 2.

TABLE 2

| | radius of curvature (nm) | aspect ratio | Ra (nm) | P-V value (nm) |
|---|---|---|---|---|
| state 1 (without residue) (Ti/TiN/Al—Ti/Ti) | min. 420 | max. 0.226 | 10.42 | 67.82 |
| state 2 (with residue) (Ti/TiN/Al—Si/Ti) | min. 10.5 | max. 0.718 | 18.56 | 185.1 |

The radius of curvature of an irregularity portion in the state 1 of a quasi electrode sample without residue is 420 nm. The minimum radius of curvature of an irregularity portion in the state 2 of a quasi electrode sample is 10.5 nm, which is approximately fortieth of that of state 1. An aspect ratio of the irregularities on the surface in the state 1 of a quasi electrode sample without residue is approximately 0.2. An aspect ratio in the state 2 of a quasi electrode sample is 0.7, which is more than three times as much as that in the state 1. A large value of the aspect ratio suggests that irregularities are sharp and have needle-like shapes, so that the coverage of an organic light-emitting layer is greatly affected by the irregularities. If there is an irregularity having large aspect ratio that is beyond the bounds of permissibility, it is known that defects such as short-circuiting is caused.

For the reason of coverage of the organic compound layer that is actually formed in an upper portion of the electrode, it is desirable that the minimum radius of curvature of an irregularity on a surface is at least 300 nm (preferably, at least 400 nm), and the aspect ratio of an irregularity on a surface is at most 0.4 (preferably, at most 0.3). If radius of curvature and aspect ratio are within the range of the above numeric value, it is possible that an extreme thin organic compound layer can be formed with well coverage and deterioration such as short-circuiting can be prevented.

Example 4

Figure 5A:
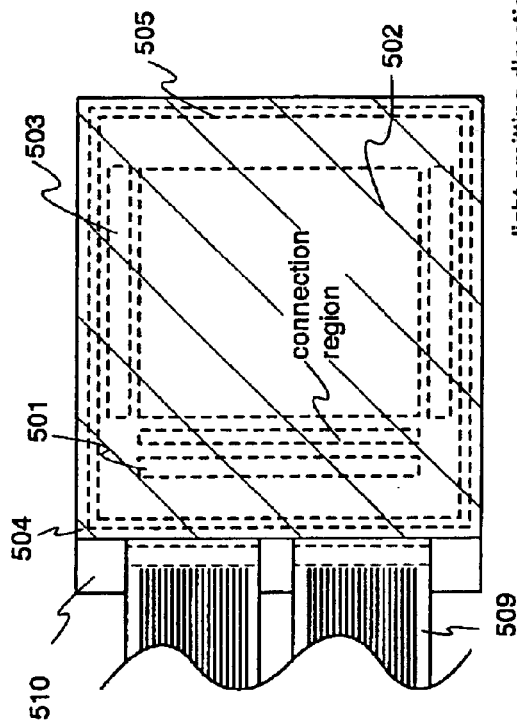
FIGS. 5A and 5B are explanatory views showing Example 4.
Figure 5B:
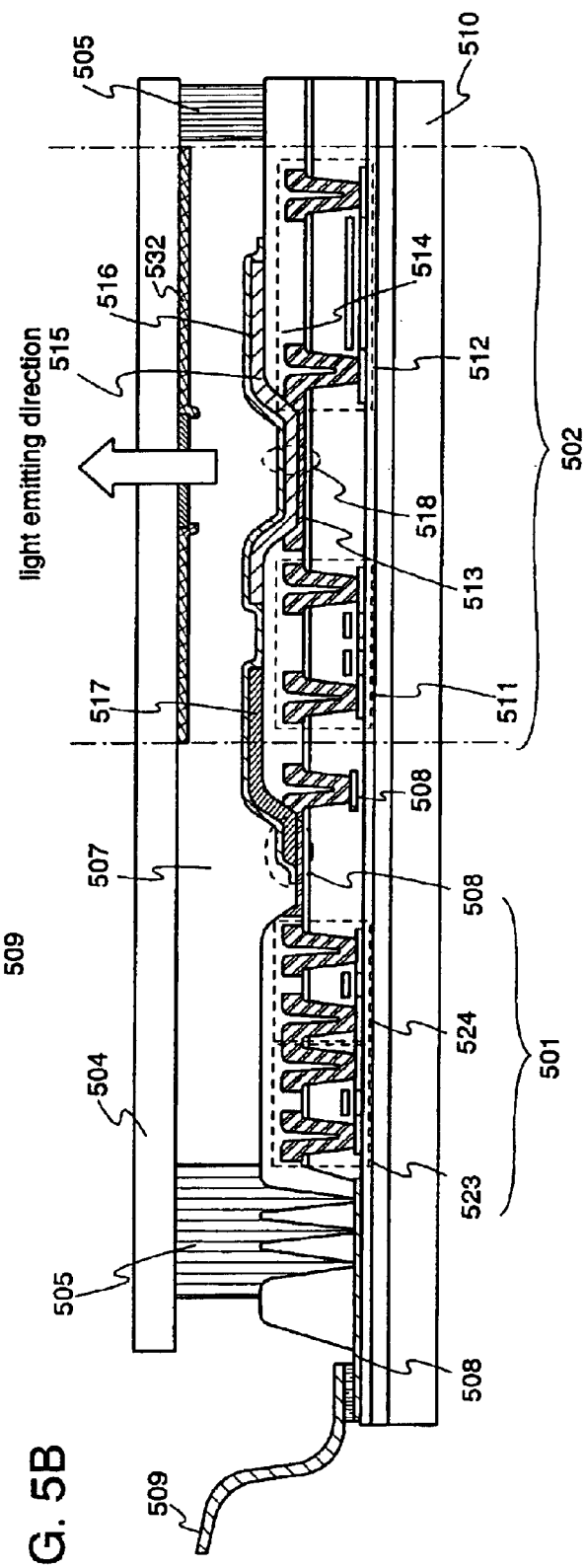

In this example, an external view of an active matrix light-emitting apparatus will be described with reference to FIG. 5. FIG. 5A is a top view showing the light-emitting apparatus, and FIG. 5B is a cross-sectional view taken along the line A–A' of FIG. 5A. Reference numeral 501 indicated by the dotted line denotes a source signal line driver circuit; 502 denotes a pixel portion; and 503, a gate signal line driver circuit. Further, reference numeral 504 denotes a sealing substrate; 505, a sealant; and 507, space surrounded by the sealant 505.

Reference numeral 508 denotes a wiring for transmitting a signal to be inputted to the source signal line driver circuit 501 and the gate signal line driver circuit 503. The wiring 508 receives a video signal or a clock signal from a flexible printed circuit (FPC) 509 which becomes an external input terminal. Although only the FPC 509 is illustrated here, a printed wiring board (PWB) may be attached to the FPC 509. A light-emitting apparatus according to the present invention includes not only the main body of the light-emitting apparatus but also the main body attached with the FPC or the PWB.

Subsequently, a cross-sectional structure will be described with reference to FIG. 5B. A driver circuit and a pixel portion are formed over the substrate 510. Here, the source signal line driver circuit 501 and the pixel portion 502 are illustrated as the driver circuit.

The source signal line driver circuit 501 is formed of a CMOS circuit that is a combination of an n-channel type TFT 523 and a p-channel type TFT 524. A TFT that constitutes the driver circuit can be formed by a known circuit such as a CMOS circuit, a PMOS circuit, or an NMOS circuit. A driver circuit formed over a substrate that is referred to a driver integrated type is described in this example, but not exclusively, the driver circuit may be formed outside of a substrate.

The pixel portion 502 is formed of a plurality of pixels, each of which includes a switching TFT 511, a current controlling TFT 512, and a first electrode (anode) 513 electrically connected to a drain of the current-controlling TFT 512.

An insulator 514 (referred to as a bank, or the like) is formed to cover an edge of the first electrode (anode) 513. A portion of the first electrode is formed to have an inclined plane along with the side face of the insulator 514. An amount of light is increased in the direction indicated by the arrow in FIG. 5 by reflecting light generated in a layer containing an organic compound 515.

A layer containing an organic compound 515 is selectively formed over the first electrode (anode) 513. Further, a second electrode (cathode) 516 is formed over the layer containing an organic compound 515. A light-emitting device 518 comprising the first electrode (anode) 513, the layer containing an organic compound 515, and the second electrode (cathode) 516 is thus formed. In this example, since the example of the light-emitting device 518 that emits white light is exemplified, a color filter (for ease of explanation, an overcoat layer is not shown here) comprising a coloring layer 531 and a BM 532 is provided.

A third electrode (auxiliary electrode) 517 is formed over the insulating layer 514 to reduce resistance of the second electrode. The second electrode (cathode) serves as a common wiring of all pixels, and connects electrically to FPC 509 via the third electrode 517 and the connection wiring 508.

Further, in order to seal the light-emitting device 518 formed over the substrate 510, the sealing substrate 504 is bonded to the substrate by the sealant 505. A spacer formed of a resin film for keeping distance between the sealing substrate 504 and the light-emitting device 518 can be provided. Inert gas such as nitride is filled with the space 507 surrounded by the sealant 505. An epoxy resin is preferably used as a material for the sealant 505. The sealant 505 preferably inhibits transmission of moisture or oxygen as possible. Substance that can absorb oxygen and moisture can be provided inside the space 507.

Further, in this example, a plastic substrate formed of fiberglass-reinforced plastics (FRP), polyvinylfluoride (PVF), Mylar, polyester, an acrylic resin, or the like, in addition to a glass substrate or a quartz substrate can be used as a material for forming the sealing substrate 504. After bonding the sealing substrate 1104, it is possible that a third sealing material is applied to a side face (exposed face) of the sealing substrate. By encapsulating the light-emitting device in the space 507 as described above, it becomes possible that the light-emitting device can be completely shielded against outside and prevented moisture or oxygen from penetrating, which causes deterioration. Consequently, high reliable light-emitting device can be obtained.

This example can be freely combined with Embodiment and Example 1.

Example 5

Given as examples of electric appliance employing a light-emitting device according to the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device mounted with a recording medium (specifically, a device mounted with a display device which can reproduce a recording medium such as a digital versatile disk (DVD), and can display the image). Specific examples of the electric appliance are shown in FIGS. 6A to 6H.

Figure 6A:
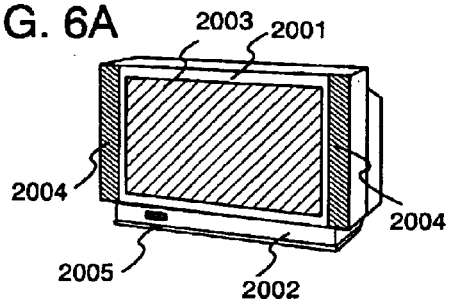
FIGS. 6A to 6H are examples of electric appliances.

FIG. 6A shows a light-emitting apparatus, which comprises a casing 2001, a supporting base 2002, a display unit 2003, speaker units 2004, a video input terminal 2005, etc. The present invention can be used for the display portion 2003. The light-emitting apparatus is self-luminous and does not need a backlight, so that it can make a thinner display portion than that of a liquid crystal display apparatus. The light-emitting apparatus includes every display apparatus for displaying information such as for a personal computer, for receiving TV broadcasting, or for advertising.

Figure 6B:
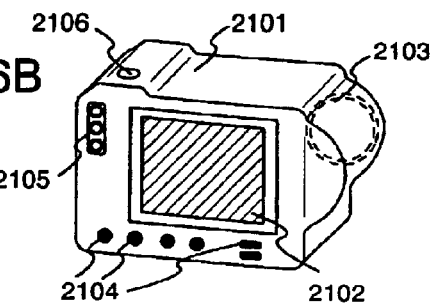

FIG. 6B shows a digital still camera, which comprises a main body 2101, a display unit 2102, an image receiving unit 2103, operation keys 2104, an external connection port 2105, a shutter 2106, etc. The present invention can be used for the display unit 2102.

Figure 6C:
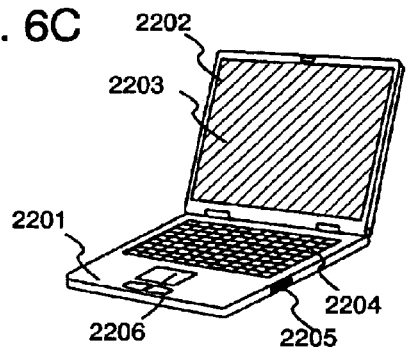

FIG. 6C shows a laptop computer, which comprises a main body 2201, a casing 2202, a display unit 2203, a keyboard 2204, an external connection port 2205, a pointing mouse 2206, etc. The present invention can be used for the display unit 2203.

Figure 6D:
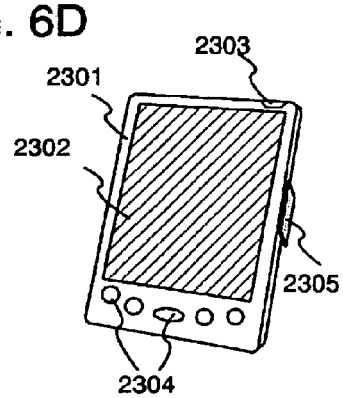

FIG. 6D shows a mobile computer, which comprises a main body 2301, a display unit 2302, a switch 2303, operation keys 2304, an infrared ray port 2305, etc. The present invention can be used for the display unit 2302.

Figure 6E:
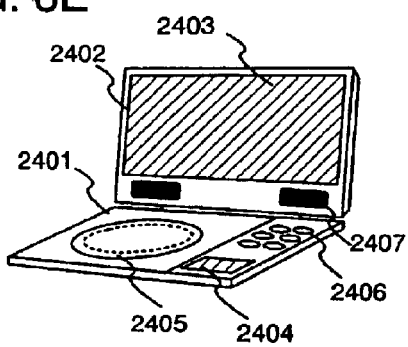

FIG. 6E shows a portable image reproducing apparatus mounted with a recording medium (a DVD player, to be specific). The apparatus comprises a main body 2401, a casing 2402, a display unit A 2403, a display unit B 2404, a recording medium (DVD or the like) reading portion 2405, operation keys 2406, speaker portions 2407, etc. The display unit A 2403 mainly displays image information whereas the display unit B 2404 mainly displays text information. The present invention can be used for the display unit A 2403 and the display unit B 2404. The image reproducing apparatus mounted with a recording medium includes domestic game machines.

Figure 6F:
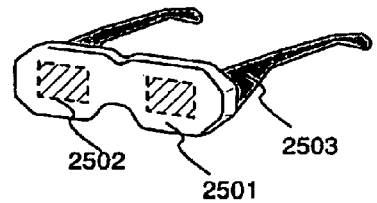

FIG. 6F shows a goggle type display (head mounted display), which comprises a main body 2501, display units 2502, and arm units 2503. The present invention can be used for the display units 2502.

Figure 6G:
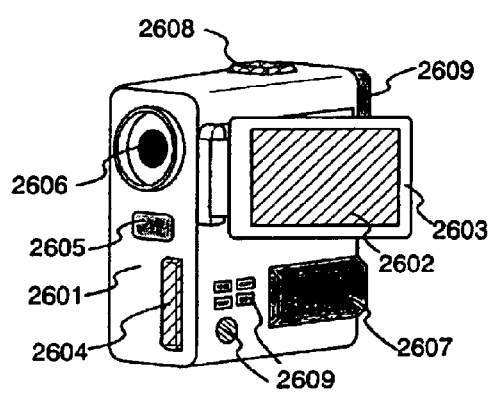

FIG. 6G shows a video camera, which comprises a main body 2601, a display unit 2602, a casing 2603, an external connection port 2604, a remote control receiving portion 3605, an image receiving portion 2606, a battery 2607, an audio input portion 3608, operation keys 2609 etc. The present invention can be used for the display unit 2602.

Figure 6H:
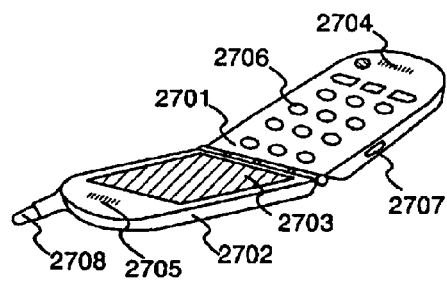

FIG. 6H shows a cellular phone, which comprises a main body 2701, a casing 2702, a display unit 2703, an audio input portion 2704, an audio output portion 2705, operation keys 2706, an external connection port 2707, an antenna 2708, etc. The light-emitting device formed by the present invention can be used for the display portion 2703. The display unit 2703 can display white characters on a black background, and power consumption of the cellular phone can be reduced.

If the luminance of organic light-emitting materials is increased in future, the materials can be used also in a front type or rear type projector by projecting and magnifying light by a lens or the like on a screen.

The above electric appliance displays have many opportunities to display information distributed through electronic communication lines such as Internet and CATV (cable television), especially, animation information. The light-emitting apparatus is suitable for displaying animation information since organic materials have fast response speed.

As described above, the application range of the present invention is very wide and can be applied to electric appliance in various fields. High-speed operation is possible in such electric appliance, consequently, display performance becomes improved. Further, the cost can be reduced since throughput is also improved.

In addition, the display shown in FIG. 6C has a small, medium or large size, for example, from 5 to 20 inches. For forming such display, a substrate with one meter on a side is preferably used to mass-produce the displays. In case of medium or large size, the auxiliary electrode shown in FIG. 4 is preferably formed.

The applicable range of the present invention is extremely large, and applied to electric appliances in various fields. The electric appliance in this embodiment can be manufactured by using any combination of structures of Embodiment and Example 1 to 4.

According to the present invention, an etching residue due to etching is prevented from generating in a first electrode during a manufacturing process in a light-emitting device having the structure that enables the total amount of light for extracting in a certain direction (in the direction passing through a second electrode) to be increased by the reflected light of an inclined plane of stepping portion of a first electrode in a lateral direction (in a parallel direction to a substrate face), wherein the light is generated in a layer containing an organic compound.

What is claimed is:

1. A light-emitting device comprising
a first electrode connected to a thin film transistor formed over a substrate having an insulating surface;
an insulator covering an edge portion of the first electrode;
a layer containing an organic compound formed on the first electrode; and
a second electrode formed on the layer containing the organic compound,
wherein the first electrode includes an edge portion comprising a first layer, a second layer, a third layer, and a fourth layer, and a central portion comprising the first layer and the second layer,
wherein the first electrode has an inclined plane between the edge portion and the central portion, and
wherein the first layer comprises titanium, the second layer comprises titanium nitride, the third layer comprises aluminum or aluminum containing titanium, and the fourth layer comprises titanium.

2. A light-emitting device according to claim 1, wherein an aspect ratio of irregularities on a surface of the second layer is at most 0.4 and a radius of curvature is at least 300 nm.

3. A light-emitting device according to claim 1, wherein the light-emitting device is incorporated in at least one selected from the group consisting of a digital camera, a laptop computer, a mobile computer, a portable image reproducing apparatus, a goggle type display, a video camera, and a cellular phone.

4. A light-emitting device comprising:
a first electrode connected to a thin film transistor formed over a substrate having an insulating surface;
an insulator covering an edge portion of the first electrode;
a layer containing an organic compound formed on the first electrode; and
a second electrode formed on the layer containing the organic compound,
wherein the first electrode includes an edge portion comprising a first layer, a second layer, a third layer, and a fourth layer, and a central portion comprising the first layer and the second layer,
wherein the first electrode has an inclined plane between the edge portion and the central portion,
wherein the inclined plane comprises the third layer and the fourth layer,
wherein the second layer is exposed at a surface of the central portion, and wherein the first layer comprises titanium, the second layer comprises titanium nitride, the third layer comprises aluminum or aluminum containing titanium, and the fourth layer comprises titanium.

5. A light-emitting device according to claim 4, wherein an aspect ratio of irregularities on a surface of the second layer is at most 0.4 and a radius of curvature is at least 300 nm.

6. A light-emitting device according to claim 4, wherein the light-emitting device is incorporated in at least one selected from the group consisting of a digital camera, a laptop computer, a mobile computer, a portable image reproducing apparatus, a goggle type display, a video camera, and a cellular phone.

7. A light-emitting device according to claim 1, wherein the first electrode is formed over an interlayer insulating film comprising an organic material.

8. A light-emitting device according to claim 1, wherein the layer containing the organic compound is in contact with the inclined plane.

9. A light-emitting device according to claim 1, wherein the thin film transistor is a top gate type transistor.

10. A light-emitting device comprising
a first electrode connected to a thin film transistor formed over a substrate having an insulating surface;
an insulator covering an edge portion of the first electrode;
a layer containing an organic compound formed on the first electrode; and
a second electrode formed on the layer containing the organic compound,
wherein the first electrode includes a first portion comprising a first layer, a second layer, a third layer, and a fourth layer, and a second portion comprising the first layer and the second layer,
wherein the first electrode has an inclined plane between the first portion and the second portion, and
wherein the first layer comprises titanium, the second layer comprises titanium nitride, the third layer comprises aluminum, and the fourth layer comprises titanium.

11. A light-emitting device according to claim 10, wherein an aspect ratio of irregularities on a surface of the second layer is at most 0.4 and a radius of curvature is at least 300 nm.

12. A light-emitting device according to claim 10, wherein the light-emitting device is incorporated in at least one selected from the group consisting of a digital camera, a laptop computer, a mobile computer, a portable image reproducing apparatus, a goggle type display, a video camera, and a cellular phone.

13. A light-emitting device according to claim 10, wherein the first electrode is formed over an interlayer insulating film comprising an organic material.

14. A light-emitting device according to claim 10, wherein the layer containing the organic compound is in contact with the inclined plane.

15. A light-emitting device according to claim 10, wherein the thin film transistor is a top gate type transistor.

16. A light-emitting device comprising:
a first electrode connected to a thin film transistor formed over a substrate having an insulating surface;
an insulator covering an edge portion of the first electrode;
a layer containing an organic compound formed on the first electrode; and
a second electrode formed on the layer containing the organic compound,
wherein the first electrode includes a first portion comprising a first layer, a second layer, a third layer, and a fourth layer, and a second portion comprising the first layer and the second layer,
wherein the first electrode has an included plane between the first portion and the second portion,
wherein the inclined plane comprises the third layer and the fourth layer, and
wherein the first layer comprises titanium, the second layer comprises titanium nitride, the third layer comprises aluminum, and the fourth layer comprises titanium.

17. A light-emitting device according to claim 16, wherein an aspect ratio of irregularities on a surface of the second layer is at most 0.4 and a radius of curvature is a least 300 nm.

18. A light-emitting device according to claim 16, wherein the light-emitting device is incorporated in at least one selected from the group consisting of a digital camera, a laptop computer, a mobile computer, a portable image reproducing apparatus, a goggle type display, a video camera, and a cellular phone.

19. A light-emitting device according to claim 16, wherein the first electrode is formed over an interlayer insulating film comprising an organic material.

20. A light-emitting device according to claim 16, wherein the layer containing the organic compound is in contact with the inclined plane.

21. A light-emitting device according to claim 16, wherein the thin film transistor is a top gate type transistor.

22. A light-emitting device comprising
a first electrode connected to a thin film transistor formed over a substrate having an insulating surface;
an insulator covering an edge portion of the first electrode;
a layer containing an organic compound formed on the first electrode; and
a second electrode formed on the layer containing the organic compound,
wherein the first electrode includes a first portion comprising a first layer, a second layer, a third layer, and a fourth layer, and a second portion comprising the first layer and the second layer,
wherein the layer containing the organic compound is formed in contact with the second layer,
wherein the first electrode has an inclined plane between the first portion and the second portion, and
wherein the first layer comprises titanium, the second layer comprises titanium nitride, the third layer comprises aluminum, and the fourth layer comprises titanium.

23. A light-emitting device according to claim 22, wherein an aspect ratio of irregularities on a surface of the second layer is at most 0.4 and a radius of curvature is at least 300 nm.

24. A light-emitting device according to claim 22, wherein the light-emitting device is incorporated in at least one selected from the group consisting of a digital camera, a laptop computer, a mobile computer, a portable image reproducing apparatus, a goggle type display, a video camera, and a cellular phone.

25. A light-emitting device according to claim 22, wherein the first electrode is formed over an interlayer insulating film comprising an organic material.

26. A light-emitting device according to claim 22, wherein the layer containing the organic compound is in contact with the inclined plane.

27. A light-emitting device according to claim 22, wherein the thin film transistor is a top gate type transistor.

28. A light-emitting device comprising:
a first electrode connected to a thin film transistor formed over a substrate having an insulating surface;
an insulator covering an edge portion of the first electrode;
a layer containing an organic compound formed on the first electrode; and
a second electrode formed on the layer containing the organic compound,
wherein the first electrode includes a first portion comprising a first layer, a second layer, a third layer, and a fourth layer, and a second portion comprising the first layer and the second layer,
wherein the layer containing the organic compound is formed in contact with the second layer,
wherein the first electrode has an inclined plane between the first portion and the second portion,
wherein the inclined plane comprises the third layer and the fourth layer, and
wherein the first layer comprises titanium, the second layer comprises titanium nitride, the third layer comprises aluminum, and the fourth layer comprises titanium.

29. A light-emitting device according to claim 28, wherein an aspect ratio of irregularities on a surface of the second layer is at most 0.4 and a radius of curvature is at least 300 nm.

30. A light-emitting device according to claim 28, wherein the light-emitting device is incorporated in at least one selected from the group consisting of a digital camera, a laptop computer, a mobile computer, a portable image reproducing apparatus, a goggle type display, a video camera, and a cellular phone.

31. A light-emitting device according to claim 28, wherein the first electrode is formed over an interlayer insulating film comprising an organic material.

32. A light-emitting device according claim 28, wherein the layer containing the organic compound is in contact with the inclined plane.

33. A light-emitting device according claim 28, wherein the thin film transistor is a top gate type transistor.

* * * * *